United States Patent
Zhou et al.

(10) Patent No.: US 12,446,352 B2
(45) Date of Patent: Oct. 14, 2025

(54) BACK CONTACT SOLAR CELL AND MANUFACTURING METHOD THEREFOR, AND PHOTOVOLTAIC MODULE

(71) Applicant: LONGI GREEN ENERGY TECHNOLOGY CO., LTD., Xi'an (CN)

(72) Inventors: Shenghou Zhou, Xi'an (CN); Xiyan Tang, Xi'an (CN); Zhaoqing Sun, Xi'an (CN); Xiaoyu Deng, Xi'an (CN); Liang Fang, Xi'an (CN); Feng Ye, Xi'an (CN); Xixiang Xu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/108,260

(22) PCT Filed: Sep. 1, 2023

(86) PCT No.: PCT/CN2023/116537
§ 371 (c)(1),
(2) Date: Mar. 3, 2025

(87) PCT Pub. No.: WO2024/114009
PCT Pub. Date: Jun. 6, 2024

(65) Prior Publication Data
US 2025/0261475 A1   Aug. 14, 2025

(30) Foreign Application Priority Data
Dec. 1, 2022 (CN) .......................... 202211538525.1

(51) Int. Cl.
*H10F 77/14* (2025.01)
*H10F 77/20* (2025.01)

(52) U.S. Cl.
CPC ......... *H10F 77/147* (2025.01); *H10F 77/219* (2025.01)

(58) Field of Classification Search
CPC .... H10F 71/138; H10F 10/146; H10F 77/147; H10F 77/219; H10F 77/244; H10F 77/311; H10F 77/315; H10F 77/703
See application file for complete search history.

(56) References Cited

U.S. PATENT DOCUMENTS

| | | | |
|---|---|---|---|
| 2013/0112253 A1 | 5/2013 | Oh et al. | |
| 2014/0373896 A1 | 12/2014 | Matsuura et al. | |

(Continued)

FOREIGN PATENT DOCUMENTS

| | | |
|---|---|---|
| CN | 101443921 A | 5/2009 |
| CN | 102386254 A | 3/2012 |

(Continued)

OTHER PUBLICATIONS

International Search Report and Written Opinion in International Appln. No. PCT/CN2023/116537, mailed on Nov. 6, 2023, 13 pages (with English translation).

(Continued)

*Primary Examiner* — Mayla Gonzalez Ramos
(74) *Attorney, Agent, or Firm* — Fish & Richardson P.C.

(57) ABSTRACT

The present disclosure provides a back contact solar cell and a manufacturing method therefor, and a photovoltaic module, In one example, a back contact solar cell includes a semiconductor substrate, a transparent conductive layer, and an isolating protective structure. The semiconductor substrate includes a first surface and a second surface opposite to the first surface. The second surface includes N-type regions and P-type regions alternately distributed at intervals, and an isolating region between each of the N-type regions and a corresponding P-type region. The transparent (Continued)

conductive layer covers the second surface. An isolating groove extending through at least the transparent conductive layer is formed on each isolating region The isolating protective structure is formed on a partial region of a groove bottom of the isolating groove. The isolating protective structure includes at least a material of the transparent conductive layer.

12 Claims, 10 Drawing Sheets

(56) References Cited

U.S. PATENT DOCUMENTS

| | | | | |
|---|---|---|---|---|
| 2015/0011043 | A1* | 1/2015 | Shimizu | H10F 10/166 |
| | | | | 438/96 |
| 2016/0284896 | A1* | 9/2016 | Westerberg | H10F 10/146 |
| 2019/0027619 | A1* | 1/2019 | Kai | H10F 77/703 |
| 2019/0207052 | A1* | 7/2019 | Masuko | H10F 10/10 |
| 2020/0098939 | A1* | 3/2020 | Nakai | H10F 77/219 |

FOREIGN PATENT DOCUMENTS

| | | |
|---|---|---|
| CN | 112420880 A | 2/2021 |
| CN | 113284961 A | 8/2021 |
| CN | 113394304 A | 9/2021 |
| CN | 113745356 A | 12/2021 |
| CN | 113745357 A | 12/2021 |
| CN | 114038922 A | 2/2022 |
| CN | 114300546 A | 4/2022 |
| CN | 114497290 A | 5/2022 |
| CN | 216488083 U | 5/2022 |
| CN | 216597603 U | 5/2022 |
| CN | 217086578 U | 7/2022 |
| CN | 114944432 A | 8/2022 |
| CN | 115000189 A | 9/2022 |
| CN | 115000226 A | 9/2022 |
| CN | 115132858 A | 9/2022 |
| CN | 115188857 A | 10/2022 |
| CN | 115207137 A | 10/2022 |
| CN | 115224132 A | 10/2022 |
| CN | 115939240 A | 4/2023 |
| KR | 100652419 B1 | 12/2006 |
| WO | WO 2022100081 A1 | 5/2022 |

OTHER PUBLICATIONS

Office Action in Chinese Appln. No. 202211538525.1, dated May 8, 2024, 12 pages (with English translation).

* cited by examiner

BACK CONTACT SOLAR CELL AND MANUFACTURING METHOD THEREFOR, AND PHOTOVOLTAIC MODULE

CROSS-REFERENCE TO RELATED APPLICATIONS

This application is a 371 national stage application of PCT Application No. PCT/CN2023/116537. filed on Sep. 1, 2023, which claims priority to Chinese Patent Application No. 202211538525.1, filed on Dec. 1, 2022. The disclosures of the aforementioned applications are hereby incorporated by reference in their entireties.

TECHNICAL FIELD

The present disclosure relates to the field of solar cell technologies, and in particular, to a back contact solar cell and a manufacturing method therefor, and a photovoltaic module.

BACKGROUND

A back contact solar cell is a solar cell in which emitters and metal contacts are arranged on its back surface and no metal electrode is arranged on its front surface. Compared with a solar cell with a metal contact arranged on its front surface, the back contact solar cell has a higher short-circuit current and photoelectric conversion efficiency, and is one of existing technical directions for realizing efficient crystalline silicon solar cells.

However, a process used for isolating N-type regions and P-type regions included in the back contact solar cell easily causes damage to the back contact solar cell, leading to a decrease in a yield of the back contact solar cell, which is not conducive to improving electrical performance of the back contact solar cell.

SUMMARY

An objective of the present disclosure is to provide a back contact solar cell and a manufacturing method therefor, and a photovoltaic module, to prevent a back contact solar cell from being damaged after N-type regions and P-type regions included in the back contact solar cell are isolated, and increase a yield of the back contact solar cell, which is conducive to improving electrical performance of the back contact solar cell.

According to a first aspect, the present disclosure provides a back contact solar cell, including: a semiconductor substrate, a transparent conductive layer, and an isolating protective structure.

The semiconductor substrate includes a first surface and a second surface opposite to the first surface. Along a direction parallel to the second surface, the second surface includes N-type regions and P-type regions alternately distributed at intervals, and an isolating region located between each of the N-type regions and a corresponding P-type region. The transparent conductive layer covers the second surface. An isolating groove extending through at least the transparent conductive layer is formed on each isolating region, and the isolating groove is configured to isolate a part of the transparent conductive layer located on the N-type region from a part of the transparent conductive layer located on the P-type region. The isolating protective structure is formed on a partial region of a groove bottom of the isolating groove. A material of the isolating protective structure includes at least a material of the transparent conductive layer.

In a case that the foregoing technical solution is used, the second surface of the semiconductor substrate included in the back contact solar cell includes N-type regions and P-type regions that are alternately distributed and an isolating region located between each of the N-type regions and a corresponding P-type region. The isolating region may isolate the N-type region and the P-type region having opposite conductivity types, thereby suppressing recombination of carriers at a transverse junction between the N-type region and the P-type region, and improving the photoelectric conversion efficiency of the back contact solar cell. In addition, the transparent conductive layer included in the back contact solar cell covers the second surface. A part of the transparent conductive layer located on the N-type region may reduce a contact barrier between the N-type region and a first electrode, which is conductive to leading out electrons: and a part of the transparent conductive layer located on the P-type region may reduce a contact barrier between the P-type region and a second electrode, which is conductive to leading out holes. Based on this, an isolating groove extending through at least the transparent conductive layer is formed on each isolating region, and the isolating groove is configured to isolate the part of the transparent conductive layer located on the N-type region from the part of the transparent conductive layer located on the P-type region, thereby preventing a short circuit of the back contact solar cell and improving the electrical stability of the back contact solar cell.

In addition, the back contact solar cell further includes an isolating protective structure formed on a partial region of a groove bottom of the isolating groove. In this case, the isolating protective structure covers a surface of a film layer exposed outside through the isolating groove, so that the isolating protective structure may prevent the film layer from being affected by operations such as etching in subsequent processes such as electrode preparation and cause the film layer to be not prone to abrasion during stacking and transport of cells, thereby improving film forming quality of the film layer, and further improving a yield of the back contact solar cell, which is conducive to improving the photoelectric conversion efficiency of the back contact solar cell. Besides, the isolating protective structure includes at least a material of the transparent conductive layer. In this case, after the transparent conductive material covering the second surface is formed, patterning processing may be performed on a part of the transparent conductive material located on the isolating region, so that a part of the transparent conductive material corresponding to the isolating groove may further form the isolating protective structure after the isolating groove is formed. In other words, there is no need to over-etch the film layer at the groove bottom of the isolating groove to isolate the N-type region from the P-type region, so that the film layer may be further protected through the isolating protective structure while the film layer exposed at the groove bottom of the isolating groove is prevented from causing an etching loss, and a yield of the back contact solar cell may be further increased, which is conducive to improving the electrical performance of the back contact solar cell.

In a possible implementation, along a length direction of the isolating groove, the isolating protective structure includes at least two isolating protective portions spaced apart from each other.

In a case that the foregoing technical solution is used, the at least two isolating protective portions included in the isolating protective structure may protect corresponding parts of the film layer exposed outside through the isolating groove along the length direction of the isolating groove, to prevent the parts of the film layer exposed outside through the isolating groove from being damaged. In addition, adjacent isolating protective portions are spaced apart from each other, so that the parts of the transparent conductive layer located on the N-type region and the P-type region can be isolated from each other through a part of the isolating groove exposed between two adjacent isolating protective portions, thereby preventing a short circuit of the back contact solar cell and improving the electrical stability of the back contact solar cell.

In a possible implementation, along the length direction of the isolating groove, a groove bottom surface of the isolating groove includes first regions and second regions distributed alternately, where the first region is a region of the groove bottom surface of the isolating groove exposed outside the isolating protective portion; the second region is a region of the groove bottom surface of the isolating groove covered by the corresponding isolating protective portion; and along the length direction of the isolating groove, a minimum width of each of the second regions is less than a maximum width of an adjacent first region.

In a case that the foregoing technical solution is used, the first region is a region of the groove bottom of the isolating groove exposed outside, no isolating protective structure is formed on a surface of the region, so that the parts of the transparent conductive layer located on the N-type region and the P-type region can be spaced through a part of the isolating groove corresponding to the first region. An isolating protective structure covers a surface of the second region. In addition, a material of the isolating protective structure includes at least a material of the transparent conductive layer, and the material of the transparent conductive layer is a conductive material. Based on this, in a case that the minimum width of each of the second regions is less than the maximum width of the adjacent first region, a ratio of a region of the groove bottom of the isolating groove on which the isolating protective structure is formed is small, so that a resistance value between the part of the transparent conductive layer located on the N-type region and the part of the transparent conductive layer located on the P-type region may be further increased, thereby improving the insulation performance between the part of the transparent conductive layer located on the N-type region and the part of the transparent conductive layer located on the P-type region, and further reducing a recombination rate of carriers at the isolating groove, which is conducive to improving the electrical performance of the back contact solar cell.

In a possible implementation, the minimum width of each of the second regions ranges from 1 $\mu$m to 100 $\mu$m. In this case, the minimum width of each of the second regions has a moderate size, so that the film layer may be prevented from being damaged due to a reduced protection effect of each isolating protective portion to a corresponding part of the film layer exposed outside through the isolating groove caused by a small minimum width, thereby ensuring a high yield of the back contact solar cell. Meanwhile, the recombination rate of carriers at the isolating groove may be further prevented from increasing caused by a small resistance value between the part of the transparent conductive layer located on the N-type region and the part of the transparent conductive layer located on the P-type region due to a large minimum width, thereby further ensuring that the parts of the transparent conductive layer located on the N-type region and the P-type region can be isolated through the isolating groove. In addition, the minimum width of each of the second regions ranges from 1 $\mu$m to 100 $\mu$m, so that there is no need to strictly control precision of a manufacturing process to form an isolating protective portion with a fixed width, thereby reducing the manufacturing difficulty of the back contact solar cell.

In a possible implementation, the at least two isolating protective portions are distributed at equal intervals along the length direction of the isolating groove. In this case, the at least two isolating protective portions included in the isolating protective structure may be uniformly distributed at the groove bottom of the isolating groove along the length direction of the isolating groove, to ensure each region of the film layer located at the groove bottom of the isolating groove and exposed outside through the isolating groove can be protected to the same degree, so that each region of the film layer exposed outside through the isolating groove has high film forming quality.

In a possible implementation, in a case that the second surface includes at least two isolating regions, different isolating protective structures located in different isolating grooves include a same quantity of isolating protective portions. In this case, each isolating protective structure may protect the film layer exposed outside through the corresponding isolating groove to the same degree, so that parts of the film layer located at groove bottoms of different isolating grooves have high film forming quality.

In a possible implementation, each isolating protective portion is a consecutive isolating protective portion; and the consecutive isolating protective portion is linear or curved.

In a case that the foregoing technical solution is used, the consecutive isolating protective portion is an isolating protective portion without an interruption thereon. Based on this, in a case that the isolating protective portion is a consecutive isolating protective portion. each isolating protective portion may cover the entire surface of the second region, so that a corresponding part of the film layer located below the second region may be totally covered. thereby preventing the part from being damaged. In addition, the consecutive isolating protective portion may be linear or curved, so that suitable shapes may be selected according to different actual application scenarios, thereby improving the applicability of the back contact solar cell provided in the present disclosure in different application scenarios. Besides, there are a plurality of optional solutions for the shape of the consecutive isolating protective portion, so that there is no need to strictly require a manufacturing condition to form a consecutive isolating protective portion with a fixed shape, thereby reducing the manufacturing difficulty of the back contact solar cell.

In a possible implementation, each isolating protective portion is a non-consecutive isolating protective portion; and the non-consecutive isolating protective portion includes a plurality of dot-shaped, block-shaped, or strip-shaped isolating protectors.

In a case that the foregoing technical solution is used, the non-consecutive isolating protective portion is an isolating protective portion with an interruption thereon. Based on this. the material of the isolating protective portion includes the material of the transparent conductive layer, and the material of the transparent conductive layer is a conductive material. so that in a case that each isolating protective portion is a non-consecutive isolating protective portion, the part of the transparent conductive layer located on the N-type region may be further isolated from the part of the transparent conductive layer located on the P-type region through the isolating protective portion, thereby further improving the electrical stability of the back contact solar cell. In addition, the plurality of isolating protectors included in the non-consecutive isolating protective portion are dot-shaped, block-shaped, or strip-shaped. It can be seen that, there are a plurality of optional solutions for the shape of the isolating protector, so that suitable shapes may be selected according to different actual application scenarios, thereby improving the applicability of the back contact solar cell provided in the present disclosure in different application scenarios. In addition, the manufacturing difficulty of the non-consecutive isolating protective portion may be further reduced.

In a possible implementation, the semiconductor substrate includes: a silicon base, a first semiconductor stack, and a second semiconductor stack. The first semiconductor stack is at least formed on a part of the silicon base corresponding to the N-type region. Along a direction away from the silicon base, the first semiconductor stack includes a first intrinsic silicon layer and an N-type doped silicon layer located on the first intrinsic silicon layer. The second semiconductor stack is at least formed on a part of the silicon base corresponding to the P-type region. Along a direction away from the silicon base, the second semiconductor stack includes a second intrinsic silicon layer and a P-type doped silicon layer located on the second intrinsic silicon layer.

In a case that the foregoing technical solution is used, both the first semiconductor stack and the second semiconductor stack are heterogeneous contact structures. Based on this, the heterogeneous contact structure has an excellent interface passivation effect and selectively collects carriers, so that the first semiconductor stack and the second semiconductor stack of heterogeneous contact structures may further improve the photoelectric conversion efficiency of the back contact solar cell.

In a possible implementation, the first semiconductor stack is further formed on a part of the silicon base corresponding to the isolating region, and the second semiconductor stack is further formed on a part of the first semiconductor stack corresponding to the isolating region; or the second semiconductor stack is further formed on a part of the silicon base corresponding to the isolating region, and the first semiconductor stack is further formed on a part of the second semiconductor stack corresponding to the isolating region; and the semiconductor substrate further includes an insulating layer, and the insulating layer is located between the part of the first semiconductor stack corresponding to the isolating region and the part of the second semiconductor stack corresponding to the isolating region.

In a case that the foregoing technical solution is used, carriers of corresponding conductivity types may respectively pass through the first intrinsic silicon layer and the second intrinsic silicon layer through a tunneling effect, and be collected by the N-type doped silicon layer or the P-type doped silicon layer. Based on this, when the part of one of the first semiconductor stack and the second semiconductor stack corresponding to the isolating region is located on the part of the other corresponding to the isolating region, the insulating layer may isolate the part of the first semiconductor stack corresponding to the isolating region from the part of the second semiconductor stack corresponding to the isolating region, thereby preventing recombination of carriers at a longitudinal junction of the first semiconductor stack and the second semiconductor stack, and further improving the photoelectric conversion efficiency of the back contact solar cell.

In a possible implementation, the groove bottom of the isolating groove is located between the first semiconductor stack and the second semiconductor stack.

In a case that the foregoing technical solution is used, description is provided by using an example in which the second semiconductor stack is formed on the part of the first semiconductor stack corresponding to the isolating region, when the groove bottom of the isolating groove is located between the first semiconductor stack and the second semiconductor stack, the isolating groove at least runs through the transparent conductive layer, the P-type doped silicon layer, and the second intrinsic silicon layer. In this case, the part of the transparent conductive layer located on the N-type region cannot be isolated from the part of the transparent conductive layer located on the P-type region through a part of the P-type doped silicon layer corresponding to the isolating region and a part of the second intrinsic silicon layer corresponding to the isolating region, thereby reducing a recombination rate of carriers and further improving the photoelectric conversion efficiency of the back contact solar cell.

In a possible implementation, a resistance value between each N-type region and the adjacent P-type region is greater than 1 kΩ and less than 100 MΩ. In this case, the resistance value is moderate, so that a large recombination rate of carriers between each N-type region and the adjacent P-type region caused by a small resistance value may be prevented, thereby ensuring that the back contact solar cell has high photoelectric conversion efficiency. In addition, a requirement of reducing an area of the isolating protective structure covering the groove bottom of the isolating groove caused by a large resistance value may be further prevented, and the film layer exposed outside through the isolating groove may be prevented from being easily damaged, thereby ensuring that the back contact solar cell has a high yield.

In a possible implementation, a part of the transparent conductive layer close to the isolating groove is turned up along a direction facing away from the semiconductor substrate.

In a case that the foregoing technical solution is used, when the part of the transparent conductive layer close to the isolating groove is turned up along the direction facing away from the semiconductor substrate, the part of the transparent conductive layer close to the isolating groove protrudes from the parts of the transparent conductive layer located on the N-type region and the P-type region. Certainly, the part of the transparent conductive layer close to the isolating groove more protrudes from the film layer exposed outside through the isolating groove. Based on this, during stacking and transport of cells, a part of one of two adjacent cells turned up through the transparent conductive layer is in contact with the other cell. In this case, even if contact parts of the two cells are worn due to friction, the part of the transparent conductive layer turned up is first affected, that is, the part of the transparent conductive layer turned up may provide a corresponding abrasion margin in an actual production process, so that the parts of the transparent conductive layer located on the N-type region and the P-type region and the film layer exposed outside through the isolating groove may be prevented from being damaged, thereby further improving a yield of the back contact solar cell.

According to a second aspect, the present disclosure further provides a photovoltaic module, including the back contact solar cell according to the first aspect and various implementations of the first aspect.

According to a third aspect, the present disclosure provides a manufacturing method for a back contact solar cell, including:

providing a semiconductor substrate, where the semiconductor substrate includes a first surface and a second surface opposite to the first surface; and along a direction parallel to the second surface, the second surface includes N-type regions and P-type regions alternately distributed at intervals, and an isolating region located between each of the N-type regions and a corresponding P-type region;

forming a transparent conductive material covering the second surface; and forming an isolating groove extending through at least the transparent conductive material on the isolating region by using a laser etching process, to form a remaining part of the transparent conductive material into a transparent conductive layer, and forming an isolating protective structure on a partial region of a groove bottom of the isolating groove. where the isolating groove is configured to isolate a part of the transparent conductive layer located on the N-type region from a part of the transparent conductive layer located on the P-type region; and a material of the isolating protective structure includes at least a material of the transparent conductive layer.

For beneficial effects of the second aspect and various implementations of the second aspect and the third aspect and various implementations of the third aspect in the present disclosure, reference may be made to beneficial effect analysis of the first aspect and various implementations of the first aspect, and details are not described herein again.

BRIEF DESCRIPTION OF THE DRAWINGS

The accompanying drawings described herein are used to provide a further understanding of the present disclosure, and form a part of the present disclosure. Exemplary embodiments of the present disclosure and description thereof are used to explain the present disclosure, and do not constitute any inappropriate limitation to the present disclosure. In the accompanying drawings.

Figure 1:
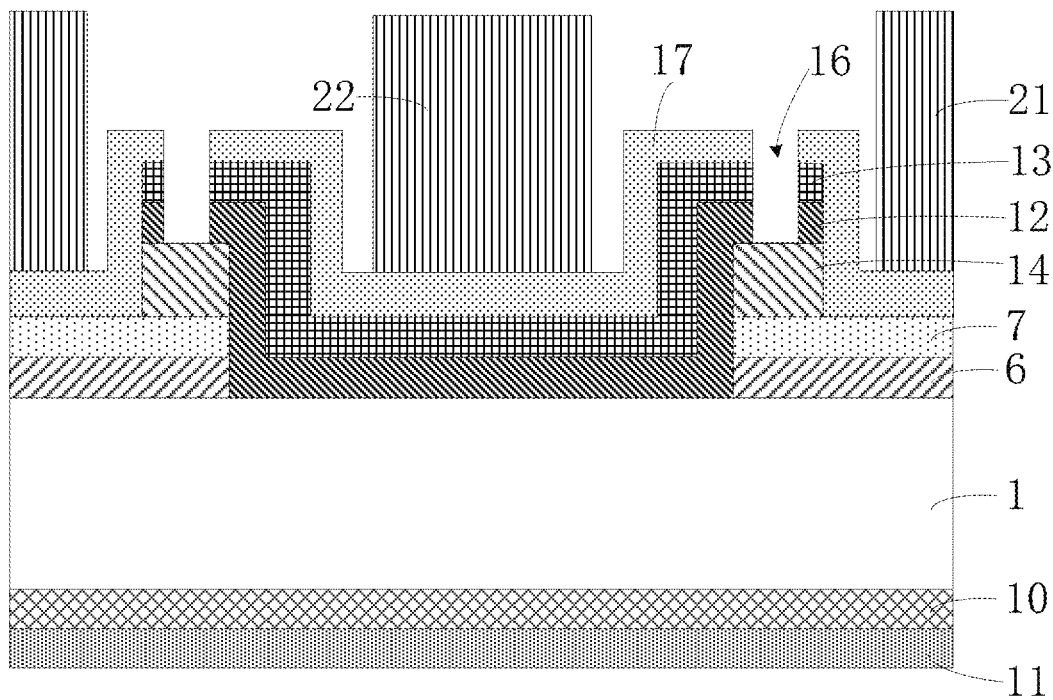
FIG. 1 is a schematic longitudinal cross-sectional view of implementing a structure after N-type regions and P-type regions are isolated in the related art.

Description of reference numerals: 1—Silicon base, 2—First intrinsic silicon material layer, 3—N-type doped silicon material layer, 4—Insulating material layer, 5—Mask layer, 6—First intrinsic silicon layer, 7—N-type doped silicon layer, 8—Second intrinsic silicon material layer, 9—P-type doped silicon material layer, 10—Third intrinsic silicon layer, 11—Anti-reflection layer, 12—Second intrinsic silicon layer, 13—P-type doped silicon layer, 14—Insulating layer, 15—Transparent conductive material, 16—Isolating groove, 17—Transparent conductive layer, 18—Isolating protective structure, 19—Isolating protective portion, 20—Isolating protector, 21—First electrode, and 22—Second electrode.

DETAILED DESCRIPTION

The following describes embodiments of the present disclosure with reference to the accompanying drawings. However, it should be understood that the description is merely exemplary and is not intended to limit a scope of the present disclosure. In addition, in the following description, description of well-known structures and technologies is omitted, to avoid unnecessary obscuring to the concept of the present disclosure.

Various schematic structural diagrams according to the embodiments of the present disclosure are shown in the accompanying drawings. The figures are not drawn to scale, and for the purpose of clear description, some details are enlarged, and some details may be omitted. Shapes of various regions and layers and relative size and position relationships thereof shown in the figures are merely exemplary, and there may be a deviation due to a manufacturing tolerance or technical restriction in practice, and a person skilled in the art may additionally design regions/layers having different shapes, sizes, and relative positions according to actual requirements.

In the context of the present disclosure, when a layer/element is referred to as being "on" another layer/element, the layer/element may be directly on the another layer/element, or an intermediate layer/element exists between the layer/element and the another layer/element. In addition, if a layer/element is "on" another layer/element in a direction, when the direction is turned over, the layer/element may be "below" the another layer/element. To make the technical problems to be resolved by, the technical solutions, and the beneficial effects of the present disclosure clearer and more comprehensible, the following further describes the present disclosure in detail with reference to the accompanying drawings and the embodiments. It should be understood that the specific embodiments described herein are merely used for describing the present disclosure rather than limiting the present disclosure.

In addition, the terms "first" and "second" are used merely for the purpose of description, and shall not be construed as indicating or implying relative importance or implicitly specifying a quantity of indicated technical features. Therefore, a feature defined by "first" or "second" may explicitly indicate or implicitly include one or more features. In the description of the present disclosure, "a plurality of" means two or more, unless otherwise definitely and specifically defined. "Several" means one or more, unless otherwise definitely and specifically defined.

In the description of the present disclosure, it should be noted that, unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediate medium, internal communication between two elements, or an interactive relationship between two elements. A person of ordinary skill in the art can understand specific meanings of the terms in the present disclosure according to specific situations.

At present, solar cells are increasingly widely used as a new energy alternative solution. A photovoltaic solar cell is an apparatus converting sun's light energy into electric energy. Specifically, the solar cell generates carriers by using the photovoltaic principle, and leads the carriers out by using electrodes, thereby facilitating the effective use of the electric energy.

When a positive electrode and a negative electrode included in the solar cell are both located on a back surface of the solar cell, the solar cell is a back contact solar cell. Existing back contact solar cells include a metal wrap through (MWT) solar cell, an interdigitated back contact (IBC) solar cell, and the like. A main characteristic of the IBC solar cell is that emitters and metal contact are all located on a back surface of the solar cell, and a front surface is not blocked by metal electrodes, so that the IBC solar cell has a higher short-circuit current Isc. In addition, the back surface of the IBC solar cell may allow a wider metal grid wire to reduce series resistance Rs, so that a fill factor FF can be improved. In addition, this solar cell without blocking on the front surface is more beautiful in addition to having high photoelectric conversion efficiency. Besides, it is easier to assemble an all-back electrode module, so that the IBC solar cell is one of existing technical directions for realizing efficient crystalline silicon solar cells.

In an actual application process, as shown in FIG. 1, a back contact solar cell generally includes a semiconductor substrate and a transparent conductive layer 17. The semiconductor substrate includes a first surface and a second surface opposite to the first surface. Along a direction parallel to the second surface, the second surface includes N-type regions and P-type regions alternately distributed at intervals, and an isolating region located between each of the N-type regions and a P-type region. The transparent conductive layer 17 covers the second surface. In addition, an isolating groove 16 extending through at least the transparent conductive layer 17 is formed on each isolating region, and the isolating groove 16 is configured to isolate a part of the transparent conductive layer 17 located on the N-type region from a part of the transparent conductive layer 17 located on the P-type region. Based on this, in an actual manufacturing process, after the semiconductor substrate is formed, a transparent conductive material covering the second surface is generally formed by using a process such as physical vapor deposition. Patterning processing is then performed on a part of the transparent conductive material located on the isolating region, to at least totally remove a part of the transparent conductive material corresponding to a space in which the isolating groove 16 is located, to isolate the N-type regions from the P-type regions. Generally, there are three manners for implementing the foregoing patterning processing: a manner in which photolithography and wet etching are combined, a manner in which ink printing and wet etching are combined, and a laser etching manner.

Process costs of the manner in which photolithography and wet etching are combined and the manner in which ink printing and wet etching are combined are high. As a result, the two manners are not suitable for large-scale mass production. As shown in FIG. 1, after the foregoing patterning processing is implemented by using the laser etching manner, at least the part of the transparent conductive material corresponding to the space in which the isolating groove 16 is located is totally removed. As a result, a film layer located at a groove bottom of the isolating groove 16 is totally exposed outside, and the film layer is easily affected by operations such as etching in subsequent processes such as electrode preparation and prone to abrasion during stacking and transport of cells, finally leading to a decrease in a yield of the back contact solar cell, which is not conducive to improving the electrical performance of the back contact solar cell.

To resolve the foregoing technical problems, according to a first aspect, an embodiment of the present disclosure provides a back contact solar cell. As shown in FIG. 9 to FIG. 12, the back contact solar cell includes: a semiconductor substrate, a transparent conductive layer 17, and an isolating protective structure 18.

As shown in FIG. 9 to FIG. 12, the semiconductor substrate includes a first surface and a second surface opposite to the first surface. Along a direction parallel to the second surface, the second surface includes N-type regions and P-type regions alternately distributed at intervals, and an isolating region located between each of the N-type regions and a corresponding P-type region. The transparent conductive layer 17 covers the second surface. An isolating groove 16 extending through at least the transparent conductive layer 17 is formed on each isolating region, and the isolating groove 16 is configured to isolate a part of the transparent conductive layer 17 located on the N-type region from a part of the transparent conductive layer 17 located on the P-type region. The isolating protective structure 18 is formed on a partial region of a groove bottom of the isolating groove 16. A material of the isolating protective structure 18 includes at least a material of the transparent conductive layer 17.

Specifically, a specific structure of the semiconductor substrate may be set according to an actual application scenario, which is not specifically limited herein.

In a case that the back contact solar cell provided in this embodiment of the present disclosure is a back contact solar cell with no passivation contact structure formed on a back surface, the semiconductor substrate may merely include a semiconductor base, an N-type doped semiconductor layer, and a P-type doped semiconductor layer. The N-type doped semiconductor layer is formed on a part of the semiconductor base corresponding to the N-type region, or the N-type doped semiconductor layer may alternatively be formed in a part of the semiconductor base corresponding to the N-type region. The P-type doped semiconductor layer is formed on a part of the semiconductor base corresponding to the P-type region, or the P-type doped semiconductor layer may alternatively be formed in a part of the semiconductor base corresponding to the P-type region. In this case, the N-type region of the semiconductor substrate is a region in which the N-type doped semiconductor layer is located, and the P-type region of the semiconductor substrate is a region in which the P-type doped semiconductor layer is located.

Specifically, the semiconductor base may be a base of a semiconductor material such as a silicon base, a silicon germanium base, or a germanium base. In terms of conductivity types, the semiconductor substrate may be an intrinsic conductive substrate, an N-type conductive substrate, or a P-type conductive substrate. Preferably, the semiconductor substrate is an N-type conductive substrate or a P-type conductive substrate. Compared with the intrinsic conductive substrate, the N-type conductive substrate or the P-type conductive substrate has a higher conductivity, which is conducive to reducing the series resistance of the back contact solar cell and improving the efficiency of the back contact solar cell. When the N-type doped semiconductor layer and the P-type doped semiconductor layer are respectively formed on the parts of the semiconductor base corresponding to the N-type region and the P-type region. materials of the N-type doped semiconductor layer and the P-type doped semiconductor layer may each be silicon, silicon germanium, germanium, or silicon carbide. In terms of internal arrangement forms of substances, the N-type doped semiconductor layer and the P-type doped semiconductor layer may be amorphous, microcrystalline, monocrystalline, nanotube, or polycrystalline doped semiconductor layers.

In addition, the back contact solar cell provided in this embodiment of the present disclosure may alternatively be a back contact solar cell with a passivation contact structure formed on the back surface. In this case, a corresponding passivation contact structure may be formed merely in the N-type region of the semiconductor substrate, or a corresponding passivation contact structure may be formed merely in the P-type region of the semiconductor substrate, or corresponding passivation contact structures may be formed in both the N-type region and the P-type region of the semiconductor substrate.

The following is described by using an example in which corresponding passivation contact structures are formed in both the N-type region and the P-type region of the semiconductor substrate: The semiconductor substrate includes a semiconductor base, a first passivation layer, an N-type doped semiconductor layer, a second passivation layer, and a P-type doped semiconductor layer. Along a direction facing away from the semiconductor base. the first passivation layer and the N-type doped semiconductor layer are at least formed on the part of the semiconductor base corresponding to the N-type region. Along the direction facing away from the semiconductor base, the second passivation layer and the P-type doped semiconductor layer are at least formed on the part of the semiconductor base corresponding to the P-type region. In this case, the N-type region of the semiconductor substrate is a region in which the N-type doped semiconductor layer is in contact with the transparent conductive layer, and the P-type region of the semiconductor substrate is a region in which the P-type doped semiconductor layer is in contact with the transparent conductive layer. The isolating region is a region located between each N-type region and an adjacent P-type region.

Specifically, in terms of materials, materials of the first passivation layer, the N-type doped semiconductor layer, the second passivation layer, and the P-type doped semiconductor layer may be respectively determined according to types of passivation contact structures formed in the N-type region and the P-type region. For example, when the passivation contact structure formed in the N-type region of the semiconductor substrate is a tunneling passivation contact structure, the first passivation layer is a tunneling passivation layer, and a material of the tunneling passivation layer may include one or more of silicon oxide, aluminum oxide. titanium oxide, hafnium dioxide, gallium oxide, tantalum pentoxide, niobium pentoxide. silicon nitride, silicon carbonitride, aluminum nitride, titanium nitride, or titanium carbonitride. In this case, the N-type doped semiconductor layer is an N-type doped polysilicon layer. In another example, when the passivation contact structure formed in the N-type region of the semiconductor substrate is a heterogeneous contact structure, the first passivation layer is an intrinsic amorphous silicon layer, an intrinsic microcrystalline silicon layer, or a mixed layer of intrinsic microcrystalline silicon and amorphous silicon. In this case, the N-type doped silicon layer is a mixed layer of an N-type amorphous silicon layer, an N-type microcrystalline silicon layer, or N-type amorphous silicon and microcrystalline silicon.

For materials of the second passivation layer and the P-type doped semiconductor layer, reference may be made to the material analysis of the first passivation layer and the N-type doped semiconductor layer, and details are not described herein.

In terms of passivation types, when corresponding passivation contact structures are formed in both the N-type region and the P-type region of the semiconductor substrate, types of the passivation contact structures formed in the N-type region and the P-type region may be the same. For example, tunneling passivation contact structures may be formed in both the N-type region and the P-type region of the semiconductor substrate. Alternatively, heterogeneous contact structures may be formed in both the N-type region and the P-type region of the semiconductor substrate.

Certainly, when corresponding passivation contact structures are formed in both the N-type region and the P-type region of the semiconductor substrate, the types of the passivation contact structures formed in the N-type region and the P-type region may alternatively be different. For example, a tunneling passivation contact structure is formed in one of the N-type region and the P-type region of the semiconductor substrate, and a heterogeneous contact structure is formed in the other of the N-type region and the P-type region of the semiconductor substrate.

When heterogeneous contact structures are formed in both the N-type region and the P-type region of the semiconductor substrate, as shown in FIG. 9 to FIG. 12, the semiconductor substrate includes: a silicon base 1, a first semiconductor stack, and a second semiconductor stack. The first semiconductor stack is at least formed on a part of the silicon base 1 corresponding to the N-type region. Along a direction away from the silicon base 1, the first semiconductor stack includes a first intrinsic silicon layer 6 and an N-type doped silicon layer 7 located on the first intrinsic silicon layer 6. The second semiconductor stack is at least formed on a part of the silicon base I corresponding to the P-type region. Along a direction away from the silicon base 1, the second semiconductor stack includes a second intrinsic silicon layer 12 and a P-type doped silicon layer 13 located on the second intrinsic silicon layer 12. Thicknesses of the first intrinsic silicon layer 6, the N-type doped silicon layer 7, the second intrinsic silicon layer 12, and the P-type doped silicon layer 13 may be set according to an actual application scenario. For example, the thickness of the first intrinsic silicon layer 6 or the second intrinsic silicon layer 12 may range from 3 nm to 15 nm. The thickness of the N-type doped silicon layer 7 or the P-type doped silicon layer 13 may range from 3 nm to 20 nm. In this case, the heterogeneous contact structure has an excellent interface passivation effect and selectively collects carriers, so that the first semiconductor stack and the second semiconductor stack of heterogeneous contact structures may further improve the photoelectric conversion efficiency of the back contact solar cell.

In this case, the first semiconductor stack may be formed on merely the part of the silicon base corresponding to the N-type region. Alternatively, as shown in FIG. 9 to FIG. 12, the first semiconductor stack may be further formed on a part of the silicon base 1 corresponding to the isolating region. In addition, the second semiconductor stack may also be formed on merely the part of the silicon base corresponding to the P-type region. Alternatively, as shown in FIG. 9 to FIG. 12, the second semiconductor stack may be further formed on the part of the silicon base I corresponding to the isolating region.

Specifically, when the first semiconductor stack and the second semiconductor stack are further formed on the part of the silicon base corresponding to the isolating region, as shown in FIG. 9 to FIG. 12, the first semiconductor stack may be directly formed on the part of the silicon base 1 corresponding to the isolating region, and the second semiconductor stack is further formed on a part of the first semiconductor stack corresponding to the isolating region. In this case, the N-type region of the semiconductor substrate is a region in which the N-type doped semiconductor layer is exposed outside the P-type doped semiconductor layer, and the P-type region of the semiconductor substrate is a region in which the P-type doped semiconductor layer is located. Alternatively, the second semiconductor stack is directly formed on the part of the silicon base corresponding to the isolating region, and the first semiconductor stack is further formed on a part of the second semiconductor stack corresponding to the isolating region. In this case, the N-type region of the semiconductor substrate is a region in which the N-type doped semiconductor layer is located, and the P-type region of the semiconductor substrate is a region in which the P-type doped semiconductor layer is exposed outside the N-type doped semiconductor layer.

In addition, when the first semiconductor stack and the second semiconductor stack are further formed on the part of the silicon base corresponding to the isolating region, as shown in FIG. 9 to FIG. 12, the semiconductor substrate further includes an insulating layer 14, where the insulating layer 14 is located between the part of the first semiconductor stack corresponding to the isolating region and the part of the second semiconductor stack corresponding to the isolating region. A material and a thickness of the insulating layer 14 may be set according to an actual application scenario. For example, the material of the insulating layer 14 may be an insulating material like silicon oxide or silicon nitride. The thickness of the insulating layer 14 may range from 50 nm to 500 nm. In this case, carriers of corresponding conductivity types may respectively pass through the first intrinsic silicon layer 6 and the second intrinsic silicon layer 12 through a tunneling effect, and be collected by the N-type doped silicon layer 7 or the P-type doped silicon layer 13. Based on this, when the part of one of the first semiconductor stack and the second semiconductor stack corresponding to the isolating region is located on the part of the other corresponding to the isolating region, the insulating layer 14 may isolate the part of the first semiconductor stack corresponding to the isolating region from the part of the second semiconductor stack corresponding to the isolating region, thereby preventing recombination of carriers at a longitudinal junction of the first semiconductor stack and the second semiconductor stack, and further improving the photoelectric conversion efficiency of the back contact solar cell.

For the foregoing transparent conductive layer, the material of the transparent conductive layer may be set according to an actual application scenario, which is not specifically limited herein. For example, the material of the transparent conductive layer may be fluorine-doped tin oxide, aluminum-doped zinc oxide, tin-doped indium oxide, tungsten-doped indium oxide, molybdenum-doped indium oxide, cerium-doped indium oxide, or indium hydroxide.

Figure 9:
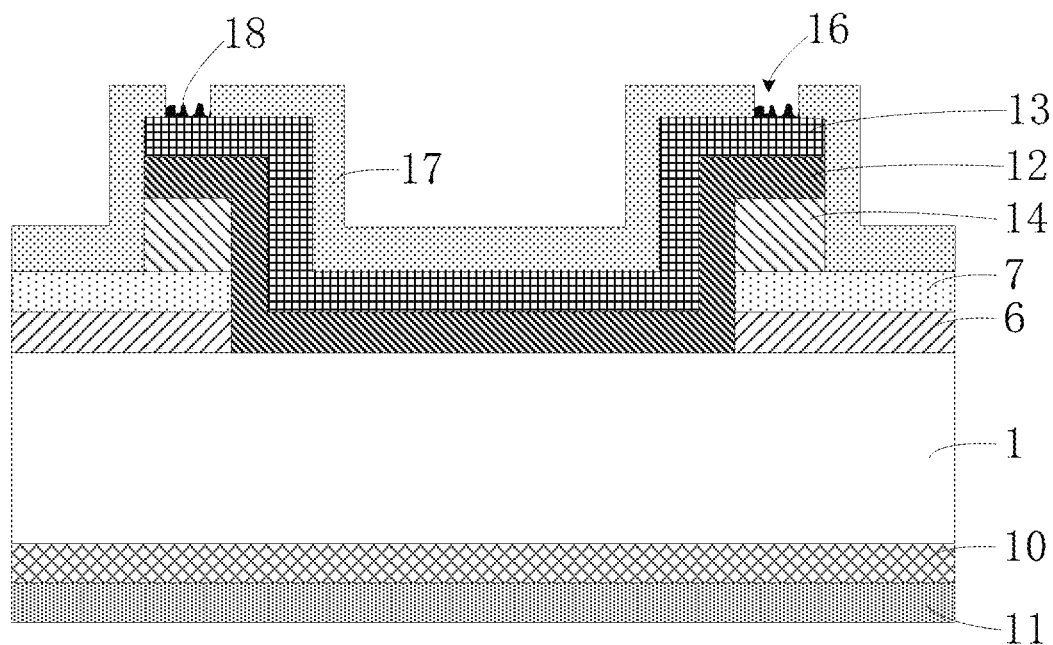
FIG. 9 is an eighth schematic structural diagram of a back contact solar cell in a manufacturing process according to an embodiment of the present disclosure.

For the foregoing isolating groove, as shown in FIG. 9, the isolating groove 16 may merely run through a part of the transparent conductive layer 17 located on the isolating region. A specific depth of the isolating groove 16 may be set according to a structure of the semiconductor substrate and an actual application scenario, provided that the isolating groove 16 can isolate the part of the transparent conductive layer 17 located on the N-type region from the part of the transparent conductive layer 17 located on the P-type region.

For the foregoing isolating protective structure, since the isolating protective structure is formed on the partial region of the groove bottom of the isolating groove, the isolating protective structure covers a surface of a film layer exposed outside through the isolating groove, so that the isolating protective structure may prevent the film layer from being affected by operations such as etching in subsequent processes such as electrode preparation and cause the film layer to be not prone to abrasion during stacking and transport of cells, thereby improving film forming quality of the film layer, and further improving a yield of the back contact solar cell, which is conducive to improving the photoelectric conversion efficiency of the back contact solar cell. Based on this, a morphology of the isolating protective structure and a specific range of the isolating protective structure covering the groove bottom of the isolating groove may be set according to a specific situation of the film layer and an actual application scenario, which are not specifically limited herein.

In addition, the isolating protective structure includes at least the material of the transparent conductive layer. Based on this, in an actual manufacturing process, as shown in FIG. 8 to FIG. 12, after the transparent conductive material 15 covering the second surface is formed, patterning processing may be performed on a part of the transparent conductive material 15 located on the isolating region, so that a part of the transparent conductive material 15 corresponding to the isolating groove 16 may further form the isolating protective structure 18 after the isolating groove 16 is formed. In other words, there is no need to over-etch the film layer at the groove bottom of the isolating groove 16 to isolate the N-type region from the P-type region, so that the film layer may be further protected through the isolating protective structure 18 while the film layer exposed at the groove bottom of the isolating groove 16 is prevented from causing an etching loss, and a yield of the back contact solar cell may be further increased, which is conducive to improving the electrical performance of the back contact solar cell. In this case, a material of the isolating protective structure 18 is related to a film layer that the isolating groove 16 runs through, and therefore may be determined according to a material of the film layer that the isolating groove 16 runs through.

For example, as shown in FIG. 9, when the isolating groove 16 merely runs through the part of the transparent conductive layer 17 located on the isolating region, the material of the isolating protective structure 18 merely includes the material of the transparent conductive layer 17.

Figure 10:
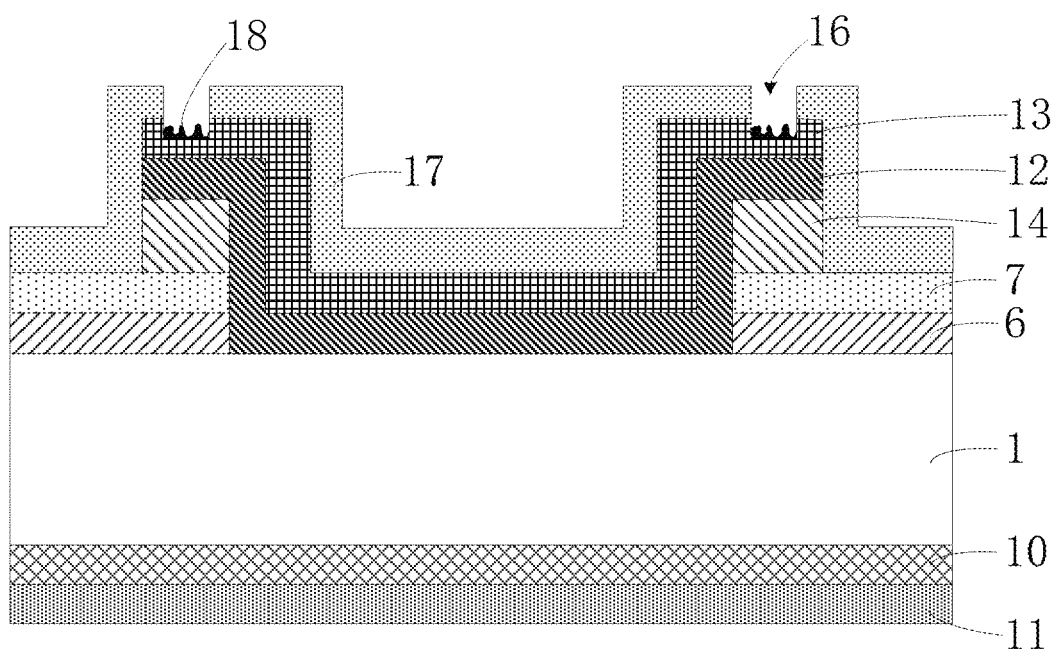
FIG. 10 is a ninth schematic structural diagram of a back contact solar cell in a manufacturing process according to an embodiment of the present disclosure.
Figure 11:
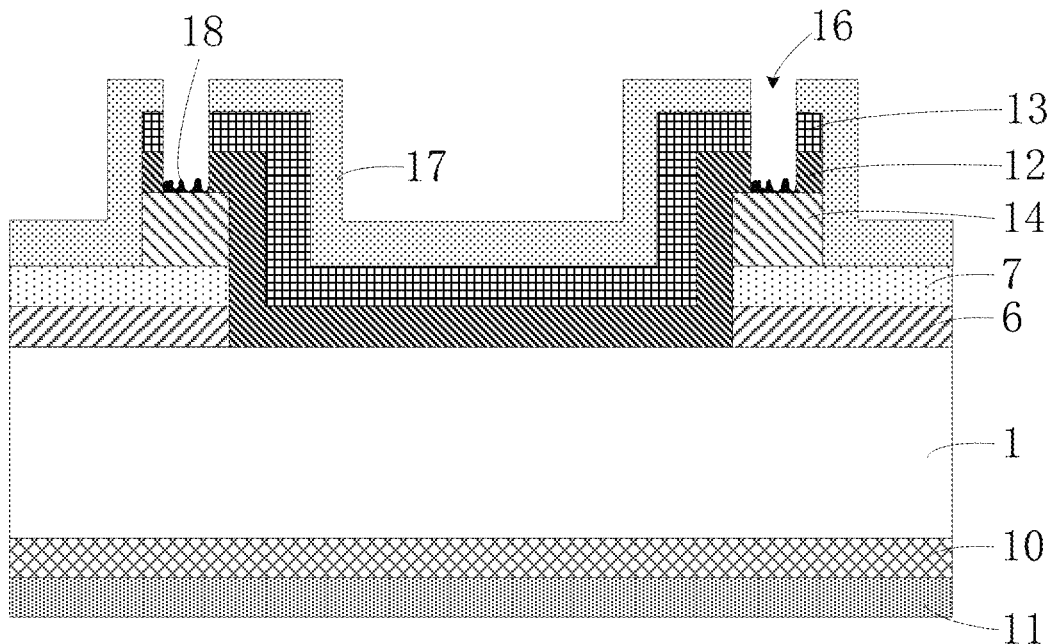
FIG. 11 is a tenth schematic structural diagram of a back contact solar cell in a manufacturing process according to an embodiment of the present disclosure.
Figure 12:
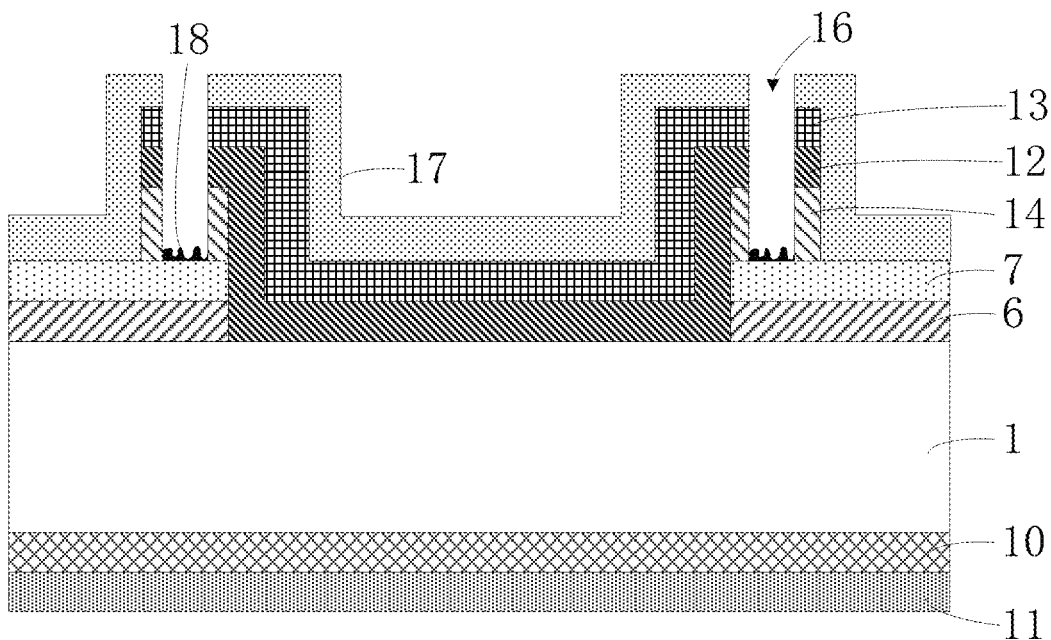
FIG. 12 is an eleventh schematic structural diagram of a back contact solar cell in a manufacturing process according to an embodiment of the present disclosure.

In another example, in a case that the semiconductor substrate includes a silicon base, a first semiconductor stack, a second semiconductor stack, and an insulating layer, as shown in FIG. 10, the isolating groove 16 may run through the transparent conductive layer 17 and a part of the P-type doped silicon layer 13. In this case, the material of the isolating protective structure 18 includes a mixed material of the transparent conductive layer 17 and the P-type doped silicon layer 13. As shown in FIG. 11, the isolating groove 16 may alternatively run through the transparent conductive layer 17, the P-type doped silicon layer 13, and the second intrinsic silicon layer 12. In this case, the material of the isolating protective structure 18 includes a mixed material of the transparent conductive layer 17, the P-type doped silicon layer 13, and the second intrinsic silicon layer 12. As shown in FIG. 12, the isolating groove 16 may alternatively run through the transparent conductive layer 17, the P-type doped silicon layer 13. the second intrinsic silicon layer 12, and the insulating layer 14. In this case, the material of the isolating protective structure 18 includes a mixed material of the transparent conductive layer 17, the P-type doped silicon layer 13, the second intrinsic silicon layer 12, and the insulating layer 14.

It should be noted that, as shown in FIG. 11 and FIG. 12, when the groove bottom of the isolating groove 16 is located between the first semiconductor stack and the second semiconductor stack, the isolating groove 16 at least runs through the transparent conductive layer 17, the P-type doped silicon layer 13, and the second intrinsic silicon layer 12. In this case, the part of the transparent conductive layer 17 located on the N-type region cannot be isolated from the part of the transparent conductive layer 17 located on the P-type region through a part of the P-type doped silicon layer 13 corresponding to the isolating region and a part of the second intrinsic silicon layer 12 corresponding to the isolating region, thereby reducing a recombination rate of carriers and further improving the photoelectric conversion efficiency of the back contact solar cell.

In a possible implementation, as shown in FIG. 14 to FIG. 17, along a length direction of the isolating groove 16, the isolating protective structure 18 includes at least two isolating protective portions 19 spaced apart from each other. In this case, the at least two isolating protective portions 19 included in the isolating protective structure 18 may protect corresponding parts of the film layer exposed outside through the isolating groove 16 along the length direction of the isolating groove 16, to prevent the parts of the film layer exposed outside through the isolating groove 16 from being damaged. In addition, adjacent isolating protective portions 19 are spaced apart from each other, so that the parts of the transparent conductive layer 17 located on the N-type region and the P-type region can be isolated from each other through a part of the isolating groove 16 exposed between two adjacent isolating protective portions 19, thereby preventing a short circuit of the back contact solar cell and improving the electrical stability of the back contact solar cell.

Specifically, a quantity of isolating protective portions included in the isolating protective structure, a gap between two adjacent isolating protective portions, and a morphology of each isolating protective portion may be set according to an actual application scenario, provided that the foregoing parameters can be applied to the back contact solar cell provided in the embodiments of the present disclosure.

In terms of quantities, each isolating protective structure may include merely two isolating protective portions, or each isolating protective structure may include three or more isolating protective portions.

In addition, in a case that the second surface includes at least two isolating regions, quantities of isolating protective portions included in different isolating protective structures located in different isolating grooves may be the same or may be different. When different isolating protective structures located in different isolating grooves include a same quantity of isolating protective portions, each isolating protective structure may protect the film layer exposed outside through the corresponding isolating groove to the same degree, so that parts of the film layer located at groove bottoms of different isolating grooves have high film forming quality.

In terms of specifications, as shown in FIG. 14 to FIG. 17, along the length direction of the isolating groove 16, a groove bottom surface of the isolating groove 16 includes first regions and second regions distributed alternately, where the first region is a region of the groove bottom surface of the isolating groove 16 exposed outside the isolating protective portion 19; the second region is a region of the groove bottom surface of the isolating groove 16 covered by the corresponding isolating protective portion 19; and along the length direction of the isolating groove 16, a minimum width of each of the second regions is less than a maximum width of an adjacent first region. Certainly, the minimum width of each of the second regions may alternatively be greater than or equal to the maximum width of the adjacent first region. In a case that the minimum width of each of the second regions is less than the maximum width of the adjacent first region, a ratio of a region of the groove bottom of the isolating groove 16 on which the isolating protective structure 18 is formed is small, so that a resistance value between the part of the transparent conductive layer 17 located on the N-type region and the part of the transparent conductive layer 17 located on the P-type region may be further increased, thereby improving the insulation performance between the part of the transparent conductive layer 17 located on the N-type region and the part of the transparent conductive layer 17 located on the P-type region, and further reducing a recombination rate of carriers at the isolating groove 16, which is conducive to improving the electrical performance of the back contact solar cell.

A specific value of the minimum width of each of the second regions and a difference between the minimum width of the second region and the maximum width of the first region may be set according to an actual requirement, which are not specifically limited herein.

For example, the minimum width of each of the second regions ranges from 1 μm to 100 μm. Based on this, when the minimum width of each of the second regions falls within this range, the film layer may be prevented from being damaged due to a reduced protection effect of each isolating protective portion to a corresponding part of the film layer exposed outside through the isolating groove caused by a small minimum width, thereby ensuring a high yield of the back contact solar cell. Meanwhile, the recombination rate of carriers at the isolating groove may be further prevented from increasing caused by a small resistance value between the part of the transparent conductive layer located on the N-type region and the part of the transparent conductive layer located on the P-type region due to a large minimum width. thereby further ensuring that the parts of the transparent conductive layer located on the N-type region and the P-type region can be isolated through the isolating groove. In addition, the minimum width of each of the second regions ranges from 1 μm to 100 μm, so that there is no need to strictly control precision of a manufacturing process to form an isolating protective portion with a fixed width, thereby reducing the manufacturing difficulty of the back contact solar cell.

Figure 14:
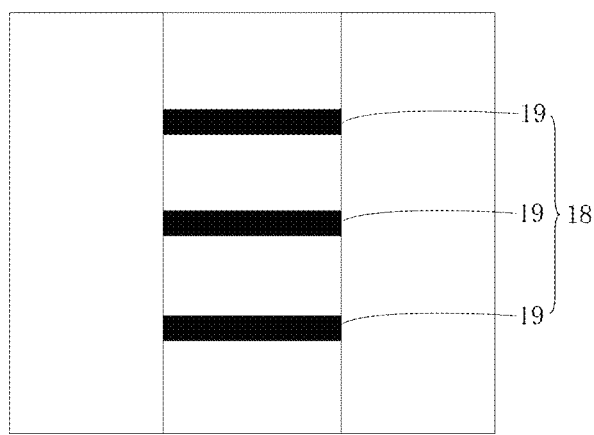
FIG. 14 is a first schematic diagram of distribution positions of isolating protective portions at a groove bottom of an isolating groove according to an implementation of the present disclosure.
Figure 15:
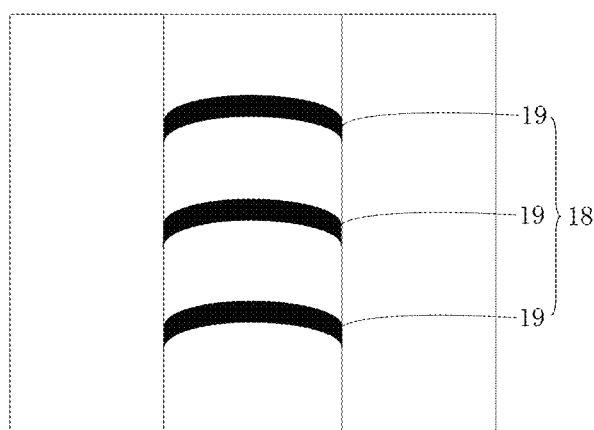
FIG. 15 is a second schematic diagram of distribution positions of isolating protective portions at a groove bottom of an isolating groove according to an implementation of the present disclosure.
Figure 16:
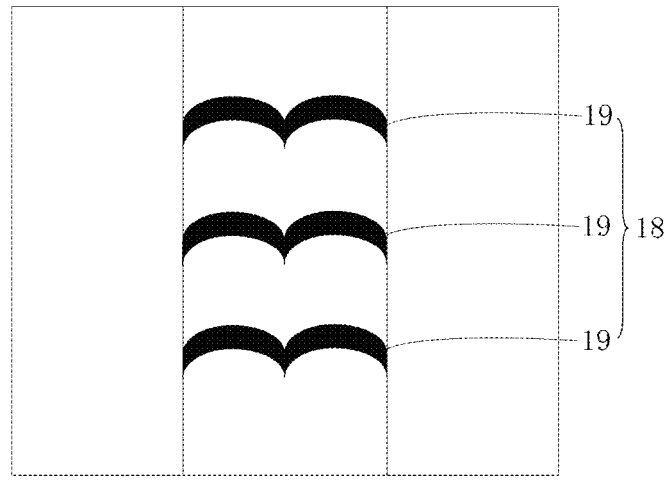
FIG. 16 is a third schematic diagram of distribution positions of isolating protective portions at a groove bottom of an isolating groove according to an implementation of the present disclosure.

In terms of distribution, in the same isolating protective structure, gaps between every two adjacent isolating protective portions may be the same or may be different. As shown in FIG. 14 to FIG. 16, when the at least two isolating protective portions 19 in the same isolating protective structure 18 are distributed at equal intervals along the length direction of the isolating groove 16, the at least two isolating protective portions 19 included in the isolating protective structure 18 may be uniformly distributed at the groove bottom of the isolating groove 16 along the length direction of the isolating groove 16, to ensure each region of the film layer located at the groove bottom of the isolating groove 16 and exposed outside through the isolating groove 16 can be protected to the same degree, so that each region of the film layer exposed outside through the isolating groove 16 has high film forming quality.

In terms of morphologies, each isolating protective portion may be a consecutive isolating protective portion or a non-consecutive isolating protective portion.

As shown in FIG. 14 to FIG. 16, the consecutive isolating protective portion is an isolating protective portion 19 without an interruption thereon. Based on this, in a case that the isolating protective portion 19 is a consecutive isolating protective portion, each isolating protective portion 19 may cover the entire surface of the second region, so that a corresponding part of the film layer located below the second region may be totally covered, thereby preventing the part from being damaged.

Specifically, as shown in FIG. 14, a shape of the consecutive isolating protective portion may be a straight line. Alternatively, as shown in FIG. 15 and FIG. 16, the consecutive isolating protective portion may also be curved. For example, as shown in FIG. 15, the consecutive isolating protective portion may be a single-arc-shaped consecutive isolating protective portion. In another example, as shown in FIG. 16, the consecutive isolating protective portion may be a double-arc-shaped consecutive isolating protective portion. The curved is curved in a broad sense. In other words, the curved may be regular curved such as arc-shaped, or may be irregular curved with different curvatures at different positions of the entire isolating protective portion.

In an actual application process, in a case that the isolating groove is formed by using a laser etching process, the shape of the consecutive isolating protective portion may be determined according to a shape and an arrangement manner of a spot emitted by a laser emitter. For example, in a case that the shape of the spot emitted by the laser emitter is a rectangle, as shown in FIG. 14, the consecutive isolating protective portion may be linear. In another example, in a case that the shape of the spot emitted by the laser emitter is a circle and etching is performed in a single-row manner, as shown in FIG. 15, the consecutive isolating protective portion may be single-arc-shaped. In another example, in a case that the shape of the spot emitted by the laser emitter is a circle and etching is performed in a double-row manner, as shown in FIG. 16, the consecutive isolating protective portion may be double-arc-shaped.

Figure 17:
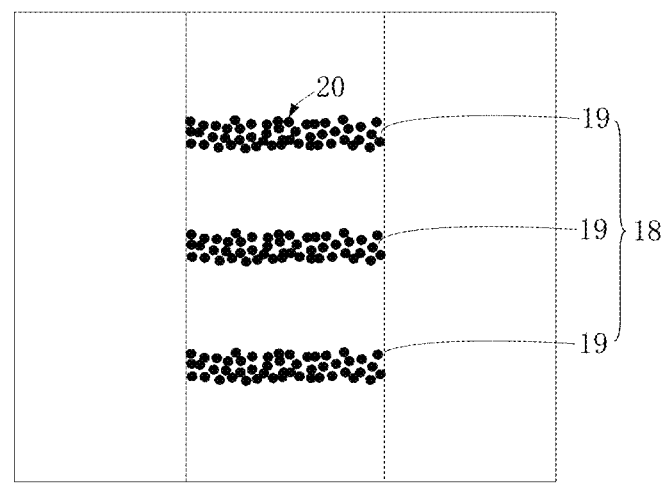
FIG. 17 is a fourth schematic diagram of distribution positions of isolating protective portions at a groove bottom of an isolating groove according to an implementation of the present disclosure.

As shown in FIG. 17, the non-consecutive isolating protective portion is an isolating protective portion 19 with an interruption thereon. Based on this, the material of the isolating protective portion 19 includes the material of the transparent conductive layer 17, and the material of the transparent conductive layer 17 is a conductive material, so that in a case that each isolating protective portion 19 is a non-consecutive isolating protective portion, the part of the transparent conductive layer 17 located on the N-type region may be further isolated from the part of the transparent conductive layer 17 located on the P-type region through the isolating protective portion 19, thereby further improving the electrical stability of the back contact solar cell.

Specifically, as shown in FIG. 17, the non-consecutive isolating protective portion may include a plurality of dot-shaped, block-shaped, or strip-shaped isolating protectors 20. A quantity of isolating protectors 20 included in the non-consecutive isolating protective portion, a size of each isolating protector 20, and a gap between every two adjacent isolating protector 20 may be randomly set. Sizes of different isolating protectors 20 included in the same non-consecutive isolating protective portion may be the same or may be different. In addition, shapes of different isolating protectors 20 included in the same non-consecutive isolating protective portion may be the same or may be different.

It can be seen that, there are a plurality of optional solutions for the shape of the isolating protector, so that suitable shapes may be selected according to different actual application scenarios, thereby improving the applicability of the back contact solar cell provided in the embodiments of the present disclosure in different application scenarios. In addition, the manufacturing difficulty of the non-consecutive isolating protective portion may be further reduced.

In an actual application process, the part of the transparent conductive layer located on the N-type region is isolated from the part of the transparent conductive layer located on the P-type region in a broad sense, provided that a resistance value between each N-type region and an adjacent P-type region can meet a working requirement. For example, the resistance value between each N-type region and the adjacent P-type region is greater than 1 kΩ and less than 100 MΩ. In this case, when the resistance value falls within this range, a large recombination rate of carriers between each N-type region and the adjacent P-type region caused by a small resistance value may be prevented, thereby ensuring that the back contact solar cell has high photoelectric conversion efficiency. In addition, a requirement of reducing an area of the isolating protective structure covering the groove bottom of the isolating groove caused by a large resistance value may be further prevented, and the film layer exposed outside through the isolating groove may be prevented from being easily damaged, thereby ensuring that the back contact solar cell has a high yield.

Figure 18:
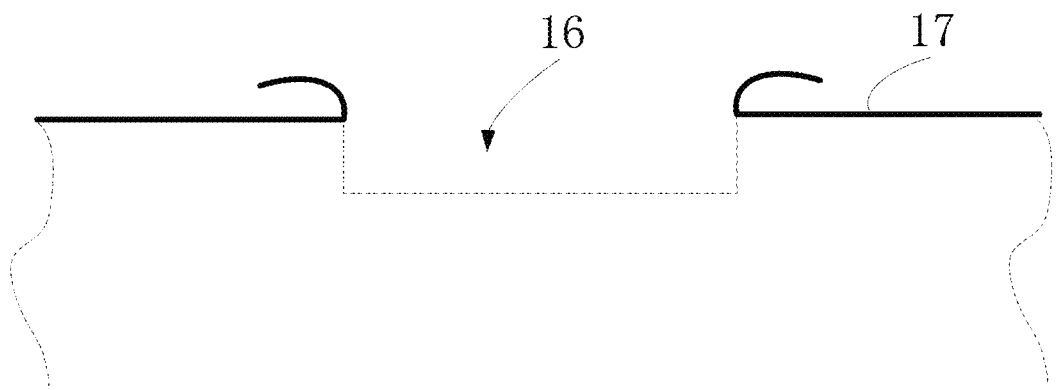
FIG. 18 is a schematic cross-sectional view of a partial structure of a part of a transparent conductive layer close to an isolating groove turned up along a direction facing away from a semiconductor substrate according to an implementation of the present disclosure.

In a possible implementation, as shown in FIG. 18, a part of the transparent conductive layer 17 close to the isolating groove 16 is turned up along a direction facing away from the semiconductor substrate.

Specifically, a width and a height of the part of the transparent conductive layer turned up may be determined according to an actual application scenario, which is not specifically limited herein. A width direction of the part of the transparent conductive layer turned up is parallel to a width direction of the isolating groove. A height direction of the part of the transparent conductive layer turned up is parallel to a depth direction of the isolating groove. For example, the width of the part of the transparent conductive layer turned up may range from 1 μm to 100 μm.

In a case that the foregoing technical solution is used, as shown in FIG. 18, when the part of the transparent conductive layer 17 close to the isolating groove 16 is turned up along the direction facing away from the semiconductor substrate, the part of the transparent conductive layer 17 close to the isolating groove 16 protrudes from the parts of the transparent conductive layer 17 located on the N-type region and the P-type region. Certainly, the part of the transparent conductive layer 17 close to the isolating groove 16 more protrudes from the film layer exposed outside through the isolating groove 16. Based on this, during stacking and transport of cells, a part of one of two adjacent cells turned up through the transparent conductive layer 17 is in contact with the other cell. In this case, even if contact parts of the two cells are worn due to friction, the part of the transparent conductive layer 17 turned up is first affected, that is, the part of the transparent conductive layer 17 turned up may provide a corresponding abrasion margin in an actual production process, so that the parts of the transparent conductive layer 17 located on the N-type region and the P-type region and the film layer exposed outside through the isolating groove 16 may be prevented from being damaged, thereby further improving a yield of the back contact solar cell.

Figure 13:
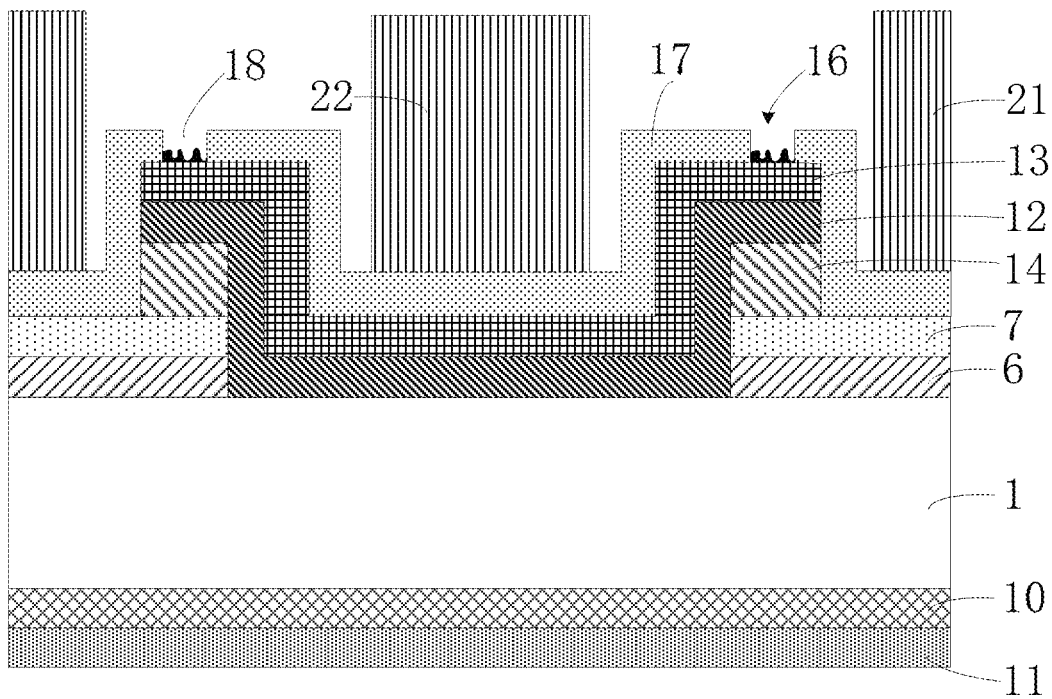
FIG. 13 is a twelfth schematic structural diagram of a back contact solar cell in a manufacturing process according to an embodiment of the present disclosure.

In some cases, as shown in FIG. 13, the back contact solar cell includes a first electrode 21 and a second electrode 22. The first electrode 21 is formed on the part of the transparent conductive layer 17 corresponding to the N-type region. The second electrode 22 is formed on the part of the transparent conductive layer 17 corresponding to the P-type region. Specifically, materials of the first electrode 21 and the second electrode 22 may be conductive materials such as copper, silver, or aluminum.

In some other cases, as shown in FIG. 13, a third intrinsic silicon layer 10 and an anti-reflection layer 11 located on the third intrinsic silicon layer 10 are formed on the first surface of the semiconductor substrate. Specifically, a thickness of the third intrinsic silicon layer 10 may be set according to an actual requirement. For example, the thickness of the third intrinsic silicon layer 10 may range from 3 nm to 15 nm. A material of the anti-reflection layer 11 may be silicon nitride, silicon oxynitride, or silicon oxide. A thickness of the anti-reflection layer 11 may range from 50 nm to 200 nm. Certainly, the thickness of the anti-reflection layer 11 may alternatively be set to other suitable values according to different application scenarios.

According to a second aspect, an embodiment of the present disclosure further provides a photovoltaic module, including the back contact solar cell according to the first aspect and various implementations of the first aspect.

According to a third aspect, an embodiment of the present disclosure provides a manufacturing method for a back contact solar cell, including the following steps:

First, a semiconductor substrate is provided, where the semiconductor substrate includes a first surface and a second surface opposite to the first surface; and along a direction parallel to the second surface, the second surface includes N-type regions and P-type regions alternately distributed at intervals, and an isolating region located between each of the N-type regions and a corresponding P-type region.

Figure 2:
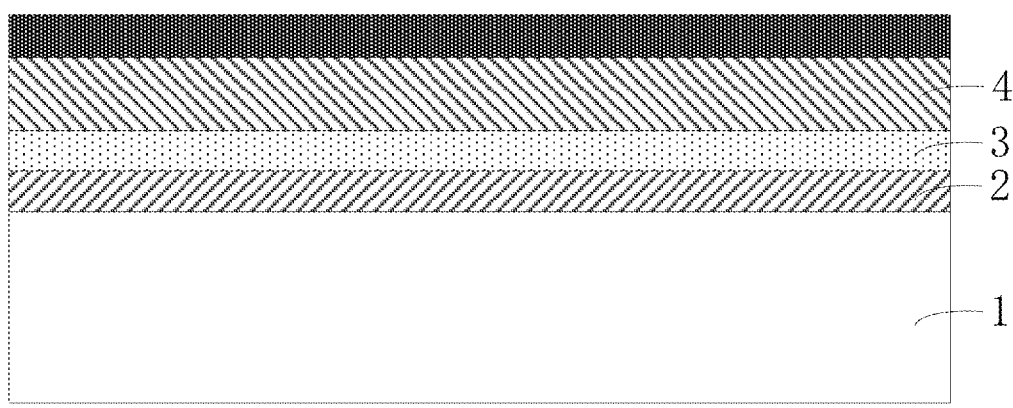
FIG. 2 is a first schematic structural diagram of a back contact solar cell in a manufacturing process according to an embodiment of the present disclosure.
Figure 3:
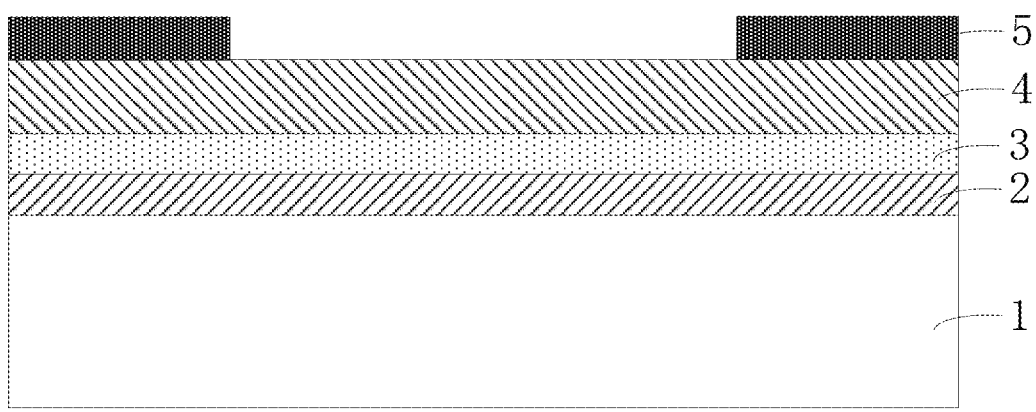
FIG. 3 is a second schematic structural diagram of a back contact solar cell in a manufacturing process according to an embodiment of the present disclosure.
Figure 4:
FIG. 4 is a third schematic structural diagram of a back contact solar cell in a manufacturing process according to an embodiment of the present disclosure.
Figure 5:
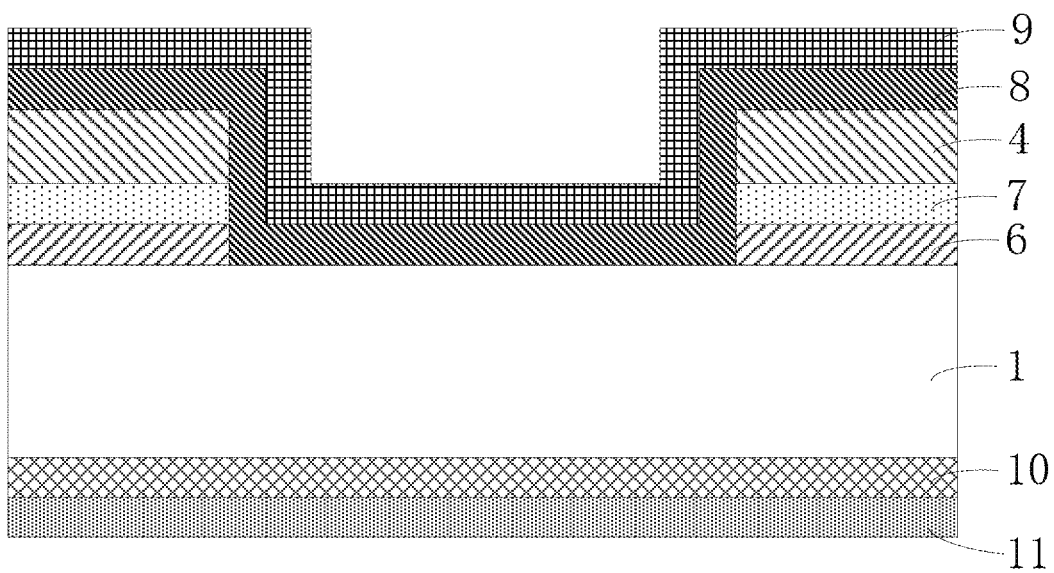
FIG. 5 is a fourth schematic structural diagram of a back contact solar cell in a manufacturing process according to an embodiment of the present disclosure.
Figure 6:
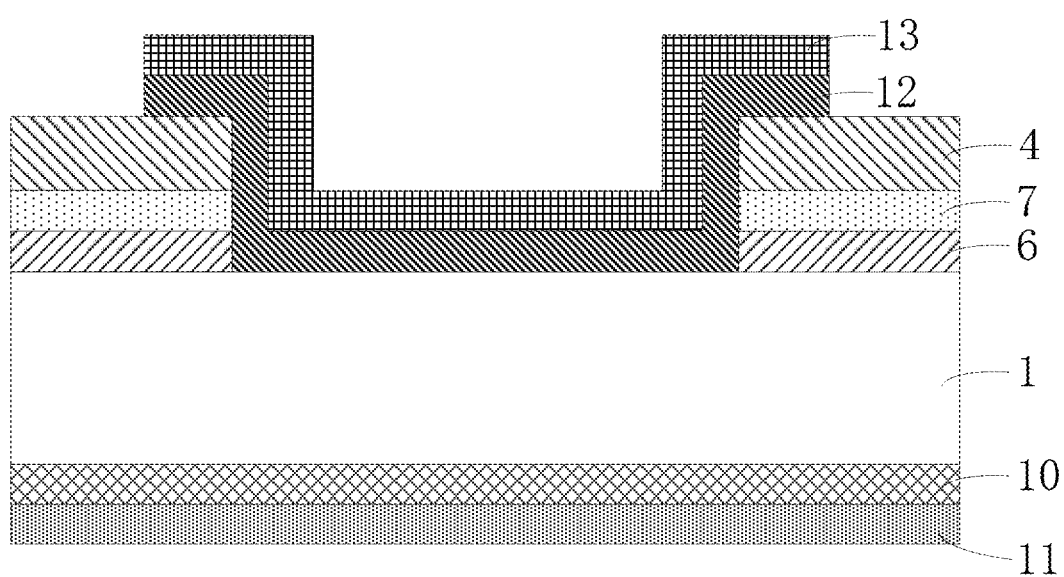
FIG. 6 is a fifth schematic structural diagram of a back contact solar cell in a manufacturing process according to an embodiment of the present disclosure.
Figure 7:
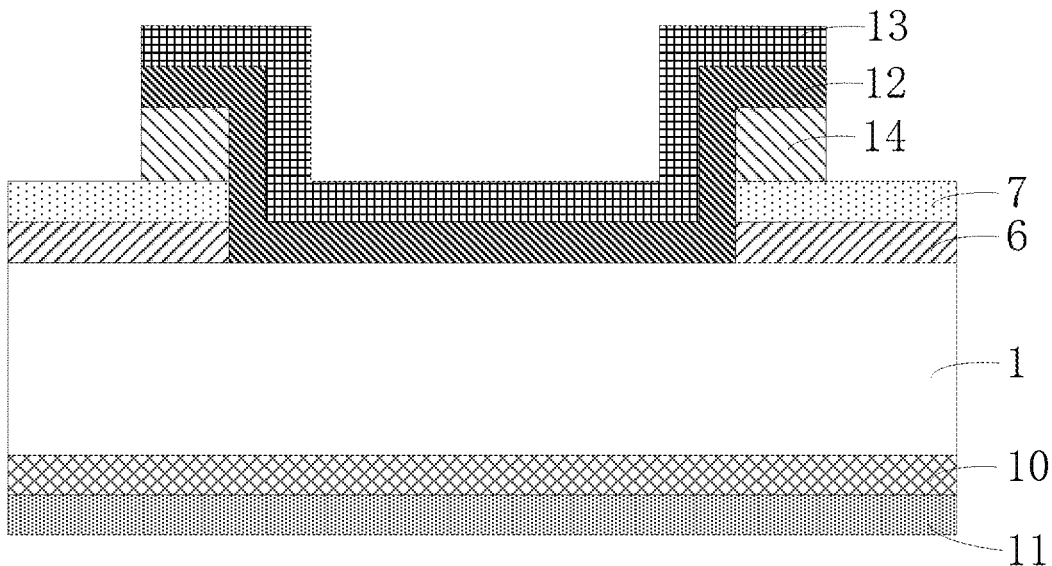
FIG. 7 is a sixth schematic structural diagram of a back contact solar cell in a manufacturing process according to an embodiment of the present disclosure.

Specifically, for information such as a specific structure and a material of the semiconductor substrate, reference may be made to the foregoing description, and details are not described herein. As shown in FIG. 7, the following is described by using an example in which the semiconductor substrate includes the silicon base 1, the first semiconductor stack, the second semiconductor stack, and the insulating layer 14, and the second semiconductor stack is further formed in the part of the first semiconductor stack corresponding to the isolating region:

As shown in FIG. 2, a first intrinsic silicon material layer 2, an N-type doped silicon material layer 3, an insulating material layer 4, and a mask material layer may be sequentially formed on a back surface of the silicon base I along a direction facing away from the silicon base I by using a process such as plasma enhanced chemical vapor deposition. Next, as shown in FIG. 3, patterning processing may be performed on the mask material layer by using a process such as laser etching, to reserve only a part of the mask material layer covering the silicon base I corresponding to the N-type region, so as to form a remaining part of the mask material layer into a mask layer 5. In addition, as shown in FIG. 4, through the mask layer, patterning processing is performed on the insulating material layer 4, the N-type doped silicon material layer, and the first intrinsic silicon material layer by using a process such as wet etching, to at least remove parts of the three film layers located on the silicon base I corresponding to the P-type region, so as to form a remaining part of the N-type doped silicon material layer into an N-type doped silicon layer 7 and form a remaining part of the first intrinsic silicon material layer into a first intrinsic silicon layer 6. The mask layer is then removed. Next, as shown in FIG. 5, a second intrinsic silicon material layer 8 and a P-type doped silicon material layer 9 covering the back surface may be sequentially formed along the direction facing away from the silicon base I by using a process such as plasma enhanced chemical vapor deposition. In addition, a third intrinsic silicon layer 10 and an anti-reflection layer 11 located on the third intrinsic silicon layer 10 are sequentially formed on a light receiving surface of the silicon base 1. A forming sequence of the second intrinsic silicon material layer 8, the P-type doped silicon material layer 9, the third intrinsic silicon layer 10. and the anti-reflection layer 11 may be determined according to an actual application scenario. which is not specifically limited herein. As shown in FIG. 6, parts of the second intrinsic silicon material layer and the P-type doped silicon material layer that are located on the N-type region may be selectively removed in a manner in which photolithography and wet etching are combined, to form a remaining part of the second intrinsic silicon material layer into a second intrinsic silicon layer 12 and form a remaining part of the P-type doped silicon material layer into a P-type doped silicon layer 13. As shown in FIG. 7, when the P-type doped silicon layer 13 and the second intrinsic silicon layer 12 function as a mask, a part of the insulating material layer exposed outside is removed by using a process such as wet etching, to form a remaining part of the insulating material layer into the insulating layer 14 to obtain the semiconductor substrate.

It should be noted that, the semiconductor substrate may be formed in a plurality of manners. A manner for forming the semiconductor substrate is not a main feature of the present disclosure, so that the manner is briefly described in this specification, and a person of ordinary skill in the art can easily implement the present disclosure. A person of ordinary skill in the art can conceive another manner to manufacture the semiconductor substrate.

Figure 8:
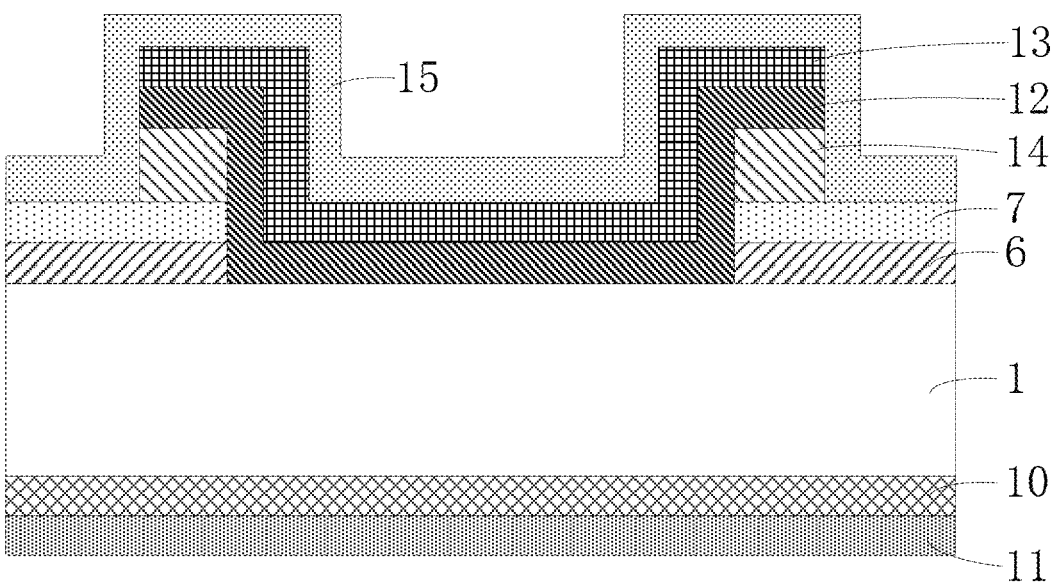
FIG. 8 is a seventh schematic structural diagram of a back contact solar cell in a manufacturing process according to an embodiment of the present disclosure.

As shown in FIG. 8, a transparent conductive material 15 covering the second surface is formed.

Specifically, the transparent conductive material may be formed by using a process such as physical vapor deposition. The transparent conductive material is a film layer for forming a transparent conductive layer, so that the transparent conductive material may be set according to material information of the transparent conductive layer described above.

As shown in FIG. 9 to FIG. 12, an isolating groove 16 extending through at least the transparent conductive material is formed on the isolating region by using a laser etching process, to form a remaining part of the transparent conductive material into a transparent conductive layer, and an isolating protective structure 18 is formed on a partial region of a groove bottom of the isolating groove 16, where the isolating groove 16 is configured to isolate a part of the transparent conductive layer located on the N-type region from a part of the transparent conductive layer located on the P-type region; and a material of the isolating protective structure 18 includes at least a material of the transparent conductive layer.

Specifically, for information such as a depth of the isolating groove and a material and a morphology of the isolating protective structure, reference may be made to the foregoing description, and details are not described herein. In addition, information such as processing type, a laser type, and a shape and an arrangement manner of a laser spot of the laser etching process may be set according to an actual application scenario, provided that an isolating protective structure manufactured by a part reserved after a corresponding processed film layer is molten by a high temperature can be formed at an edge of the laser spot in a process of forming the isolating groove. For example, in an actual application process, in a case that other factors are the same, a temperature generated by a nanosecond laser emitter is lower than a temperature generated by a picosecond laser emitter. Based on this, etching may be performed by using an ultraviolet nanosecond laser emitter with a rectangular spot whose overlap rate is greater than or equal to 0 and less than or equal to 50%. In this case, a linear isolating protective portion may be obtained.

For example, as shown in FIG. 14 to FIG. 17, along the length direction of the isolating groove 16, n a case that the isolating protective structure 18 includes at least two isolating protective portions 19, a gap between two adjacent isolating protective portions 19 may be adjusted by adjusting a diameter of the laser spot. Specifically, within a specific range, a larger diameter of the laser spot indicates a larger gap between two adjacent isolating protective portions. On the contrary, a smaller diameter of the laser spot indicates a smaller gap between two adjacent isolating protective portions.

In addition, a morphology of the isolating protective portion may be adjusted by adjusting the shape of the laser spot. For example, as shown in FIG. 14, in a case that the shape of the laser spot is adjusted to rectangular, the morphology of the isolating protective portion 19 may be linear. In another example, as shown in FIG. 15, in a case that the shape of the laser spot is adjusted to circular or elliptical, the morphology of the isolating protective portion 19 may alternatively be curved. In addition, the morphology of the isolating protective portion may also be adjusted by adjusting the arrangement manner of the laser spot. For example, as shown in FIG. 16, in a case that the shape of the laser spot is adjusted to circular or elliptical and etching is performed by using two rows of laser spots, the morphology of the isolating protective portion 19 may be double-arc-shaped.

Besides, the isolating protective portion may further be adjusted to a consecutive isolating protective portion or a non-consecutive isolating protective portion in a manner of adjusting the processing time and/or the laser type of the laser spot. Specifically, within a specific range, longer processing time and/or higher energy corresponding to the laser type indicate that the isolating protective portion is a consecutive isolating protective portion and a larger minimum width of the isolating protective portion along the length direction of the isolating groove. On the contrary, within a specific range, shorter processing time and/or lower energy corresponding to the laser type indicate that the isolating protective portion is a non-consecutive isolating protective portion and a smaller minimum width of the isolating protective portion along the length direction of the isolating groove.

In a process of forming the isolating groove by using the laser etching process, a part of the transparent conductive layer close to the isolating groove may be turned up along a direction facing away from the semiconductor substrate. Specifically, a specific condition for forming the turned-up structure may be set according to an actual application scenario, which is not specifically limited herein. For example, in a case that a material of the insulating layer is amorphous silicon, etching may be performed on the transparent conductive material by using a nanosecond laser emitter. During etching, light emitted by the nanosecond laser emitter may pass through the transparent conductive material and be absorbed by the insulating material layer made of the amorphous silicon and located below the transparent conductive material. Through phase transformation of the amorphous silicon, the transparent conductive material adhered to the insulating material layer is pushed open, so that the part of the transparent conductive layer close to the isolating groove is turned up along the direction facing away from the semiconductor substrate.

As shown in FIG. 13, in a screen printing or electroplating manner, a first electrode 21 may be formed on a part of the transparent conductive layer 17 corresponding to the N-type region, and a second electrode 22 may be formed on a part of the transparent conductive layer 17 corresponding to the P-type region. For materials of the first electrode 21 and the second electrode 22, reference may be made to the foregoing description, and details are not described herein.

For beneficial effects of the second aspect and various implementations of the second aspect and the third aspect and various implementations of the third aspect in the embodiments of the present disclosure, reference may be made to beneficial effect analysis of the first aspect and various implementations of the first aspect, and details are not described herein.

In the foregoing description, technical details such as composition of layers and etching are not described in detail. However, a person skilled in the art should understand that a layer or region having a required shape may be formed through various technical means. In addition, to form a same structure, a person skilled in the art may further design a method that is not totally the same as the method described above. In addition, although the embodiments are respectively described above, it does not mean that measures in the embodiments cannot be advantageously combined for use.

The embodiments of the present disclosure are described above. However, the embodiments are merely for the purpose of description and are not intended to limit a scope of the present disclosure. The scope of the present disclosure is defined by the appended claims and equivalents thereof. A person skilled in the art may make many replacements and modifications without departing from the scope of the present disclosure, and these replacements and modifications shall fall within the scope of the present disclosure.

The invention claimed is:

1. A back contact solar cell, comprising:
 a semiconductor substrate, wherein the semiconductor substrate comprises a first surface and a second surface opposite to the first surface, wherein along a direction parallel to the second surface, the second surface comprises N-type regions and P-type regions alternately distributed at intervals, and an isolating region located between each of the N-type regions and a corresponding P-type region;
 a transparent conductive layer covering the second surface, wherein an isolating groove extending through at least the transparent conductive layer is formed on each isolating region, and the isolating groove is configured to isolate a part of the transparent conductive layer located on an N-type region from a part of the transparent conductive layer located on a P-type region; and
 an isolating protective structure, formed on a partial region of a groove bottom of the isolating groove, wherein a material of the isolating protective structure at least comprises a material of the transparent conductive layer, wherein along a length direction of the isolating groove, and the isolating protective structure comprises at least two isolating protective portions spaced apart from each other.

2. The back contact solar cell according to claim 1, wherein along the length direction of the isolating groove, a groove bottom surface of the isolating groove comprises first regions and second regions distributed alternately,
 wherein a first region is a region of the groove bottom surface of the isolating groove exposed outside the isolating protective portions; a second region is a region of the groove bottom surface of the isolating groove covered by a corresponding isolating protective portion, and
 wherein along the length direction of the isolating groove, a minimum width of each of the second regions is less than a maximum width of an adjacent first region.

3. The back contact solar cell according to claim 2, wherein the minimum width of each of the second regions ranges from 1 µm to 100 µm.

4. The back contact solar cell according to claim 1, wherein in the same isolating protective structure, the at least two isolating protective portions are distributed at equal intervals along the length direction of the isolating groove; and/or
 wherein the second surface comprises at least two isolating regions, and different isolating protective structures located in different isolating grooves comprise a same quantity of isolating protective portions.

5. The back contact solar cell according to claim 1, wherein each isolating protective portion is a consecutive isolating protective portion, and the consecutive isolating protective portion is linear or curved; or
 wherein each isolating protective portion is a non-consecutive isolating protective portion, and the non-consecutive isolating protective portion comprises a plurality of dot-shaped, block-shaped, or strip-shaped isolating protectors.

6. The back contact solar cell according to claim 1, wherein the semiconductor substrate comprises:
 a silicon base;
 a first semiconductor stack, formed on at least a part of the silicon base corresponding to the N-type region, wherein along a direction away from the silicon base, the first semiconductor stack comprises a first intrinsic silicon layer and an N-type doped silicon layer located on the first intrinsic silicon layer; and
 a second semiconductor stack, formed on at least a part of the silicon base corresponding to the P-type region, wherein along a direction away from the silicon base, the second semiconductor stack comprises a second intrinsic silicon layer and a P-type doped silicon layer located on the second intrinsic silicon layer.

7. The back contact solar cell according to claim 6, wherein:
 the first semiconductor stack is further formed on a part of the silicon base corresponding to the isolating region, and the second semiconductor stack is further formed on a part of the first semiconductor stack corresponding to the isolating region; or
 the second semiconductor stack is further formed on a part of the silicon base corresponding to the isolating region, and the first semiconductor stack is further formed on a part of the second semiconductor stack corresponding to the isolating region; and
 wherein the semiconductor substrate further comprises an insulating layer, and the insulating layer is located between the part of the first semiconductor stack corresponding to the isolating region and the part of the second semiconductor stack corresponding to the isolating region.

8. The back contact solar cell according to claim 7, wherein the groove bottom of the isolating groove is located between the first semiconductor stack and the second semiconductor stack.

9. The back contact solar cell according to claim 1, wherein a resistance value between each N-type region and the adjacent P-type region is greater than 1 k$\Omega$ and less than 100 M$\Omega$.

10. The back contact solar cell according to claim 1, wherein a part of the transparent conductive layer close to the isolating groove is turned up along a direction facing away from the semiconductor substrate.

11. A photovoltaic module, comprising a back contact solar cell comprising:
 a semiconductor substrate, wherein the semiconductor substrate comprises a first surface and a second surface opposite to the first surface, wherein along a direction parallel to the second surface, the second surface comprises N-type regions and P-type regions alternately distributed at intervals, and an isolating region located between each of the N-type regions and a corresponding P-type region;
 a transparent conductive layer covering the second surface, wherein an isolating groove extending through at least the transparent conductive layer is formed on each isolating region, and the isolating groove is configured to isolate a part of the transparent conductive layer located on an N-type region from a part of the transparent conductive layer located on a P-type region; and an isolating protective structure, formed on a partial region of a groove bottom of the isolating groove, wherein a material of the isolating protective structure at least comprises a material of the transparent conductive layer, wherein along a length direction of the isolating groove, the isolating protective structure comprises at least two isolating protective portions spaced apart from each other.

12. A manufacturing method for a back contact solar cell, comprising:

providing a semiconductor substrate, wherein the semiconductor substrate comprises a first surface and a second surface opposite to the first surface, wherein along a direction parallel to the second surface, the second surface comprises N-type regions and P-type regions alternately distributed at intervals, and an isolating region located between each of the N-type regions and a corresponding P-type region;

forming a transparent conductive material covering the second surface; and forming an isolating groove extending through at least the transparent conductive material on the isolating region by using a laser etching process, to form a remaining part of the transparent conductive material into a transparent conductive layer, and forming an isolating protective structure on a partial region of a groove bottom of the isolating groove, wherein the isolating groove is configured to isolate a part of the transparent conductive layer located on the N-type region from a part of the transparent conductive layer located on the P-type region, wherein a material of the isolating protective structure at least comprises a material of the transparent conductive layer, and wherein along a length direction of the isolating groove, the isolating protective structure comprises at least two isolating protective portions spaced apart from each other.

* * * * *